US010854761B1

(12) United States Patent
Lee et al.

(10) Patent No.: US 10,854,761 B1
(45) Date of Patent: Dec. 1, 2020

(54) ELECTRONIC SWITCH AND ACTIVE ARTIFICIAL DIELECTRIC

(71) Applicant: Southern Methodist University, Dallas, TX (US)

(72) Inventors: Choon Sae Lee, Dallas, TX (US); Daivd A. Willis, Dallas, TX (US); Yang Fan, Dallas, TX (US)

(73) Assignee: Southern Methodist University, Dallas, TX (US)

( * ) Notice: Subject to any disclaimer, the term of this patent is extended or adjusted under 35 U.S.C. 154(b) by 188 days.

(21) Appl. No.: 15/085,422

(22) Filed: Mar. 30, 2016

Related U.S. Application Data

(60) Provisional application No. 62/140,452, filed on Mar. 30, 2015.

(51) Int. Cl.
*H01L 41/00* (2013.01)
*H01Q 1/26* (2006.01)
*G01P 15/00* (2006.01)
*H01L 29/868* (2006.01)
*H01L 29/06* (2006.01)
(Continued)

(52) U.S. Cl.
CPC ............ *H01L 29/868* (2013.01); *H01L 23/66* (2013.01); *H01L 29/0611* (2013.01); *H01L 29/0649* (2013.01); *H01L 29/6609* (2013.01); H01L 2223/6616 (2013.01); H01L 2223/6677 (2013.01)

(58) Field of Classification Search
CPC . H01L 29/0649; H01L 29/515; H01L 29/868; H01L 2924/12031; H01L 21/76289; H01L 23/525; H01L 23/5252; H01L 23/5256; H01L 23/5258; H01L 23/528
See application file for complete search history.

(56) References Cited

U.S. PATENT DOCUMENTS 3,678,414 A   7/1972   Hallford
4,053,895 A  10/1977   Malagisi
5,243,354 A   9/1993   Stern et al.
(Continued)

OTHER PUBLICATIONS

Cheng et al., "A Frequency Reconfigurable Microstrip Patch Antenna," Mechatronics and Automatic Control Systems: Proceedings of the 2013 International Conference on Mechatronics and Automatic Control Systems, Oct. 4, 2013, 7 pages.
(Continued)

Primary Examiner — Mary A Wilczewski
Assistant Examiner — Tsz K Chiu
(74) Attorney, Agent, or Firm — Fish & Richardson P.C.

(57) ABSTRACT

A electrical switch has a first substrate, a first conducting layer disposed on the first substrate, a first dielectric layer disposed on the first conducting layer and a second conducting layer disposed on the first dielectric layer, and the second conducting layer disposed on the second substrate, and a conductive via connected to the first conducting layer and extending through the first dielectric layer. Active dielectric has a first conductor, a first dielectric layer disposed on the first conducting layer, one or more electrical switches disposed on the first dielectric layer, a dielectric layer disposed between neighboring electrical switches, the second dielectric layer disposed on the last electrical switch, and the second conducting layer disposed on the second dielectric layer.

20 Claims, 7 Drawing Sheets

(51) Int. Cl.
*H01L 23/66* (2006.01)
*H01L 29/66* (2006.01)

(56) References Cited

U.S. PATENT DOCUMENTS

| | | | | |
|---|---|---|---|---|
| 6,195,047 | B1* | 2/2001 | Richards | H01P 1/127 343/700 MS |
| 7,288,873 | B2* | 10/2007 | Salsman | H01Q 1/26 310/322 |
| 7,453,143 | B2* | 11/2008 | Dutta | H01L 23/5383 257/700 |
| 8,319,278 | B1* | 11/2012 | Zeng | H01L 29/7809 257/330 |
| 9,099,775 | B2* | 8/2015 | Dussopt | H01Q 3/46 |
| 10,062,749 | B2* | 8/2018 | Chatty | H01L 29/7813 |
| 10,229,969 | B2* | 3/2019 | Kagawa | H01L 29/1045 |
| 10,374,032 | B2* | 8/2019 | Weber | H01L 29/7394 |
| 10,490,656 | B2* | 11/2019 | Willmeroth | H01L 28/20 |
| 10,529,813 | B2* | 1/2020 | Sagawa | H01L 29/4238 |
| 2003/0043071 | A1* | 3/2003 | Lilly | H01Q 3/22 342/368 |
| 2007/0018761 | A1* | 1/2007 | Yamanaka | B81C 1/00246 335/78 |
| 2008/0164518 | A1* | 7/2008 | Darwish | H01L 29/0634 257/331 |
| 2008/0303162 | A1* | 12/2008 | Ishida | H01L 29/0692 257/765 |
| 2010/0295138 | A1* | 11/2010 | Montanya Silvestre | B81C 1/00246 257/415 |
| 2011/0049649 | A1* | 3/2011 | Anderson | B81C 1/00333 257/415 |
| 2011/0147835 | A1* | 6/2011 | Radic | H01L 29/42368 257/333 |
| 2017/0243985 | A1* | 8/2017 | Kim | H01L 23/5286 |

OTHER PUBLICATIONS

Geron et al., "Electronically controlled asymmetric microstrip line coupler underpinned by an hybrid right-/left-handed line," IET Microwaves, Entennas & Propagation, vol. 6, Issue 10, Jul. 17, 2012, 7 pages.

MilitaryAerospace.com [online], "Advanced Antennas," Cyber Security: Advanced Antennas, May 1, 2011, [retrieved Dn Feb. 4, 2019], retrieved from: Url<https://www.militaryaerospace.com/articles/print/volume-22/issue-5/technology-focus/advanced-antennas.html>, 14 pages.

Patton, "Innovations in Satellite Antennas Attracting New Markets & Opportunities," Via Satellite: Innovation, Oct. 31, 2014, [retrieved on Apr. 4, 2019], retrieved from: URL<https://www.satellitetoday.com/innovation/2014/10/31/ nnovations-in-satellite-antennas-attracting-new-markets-opportunities/>, 6 pages.

Scitechdaily.com [online], "Physicists Induce Electric Currents in Insulating Dielectic Materials," Max Planck Institute, Science News, Dec. 20, 2012, [retrieved on Apr. 4, 2019], retrieved from: URL<https://scitechdaily.com/physicists-nduce-electric-currents-in-insulating-dielectric-materials/>, 10 pages.

* cited by examiner

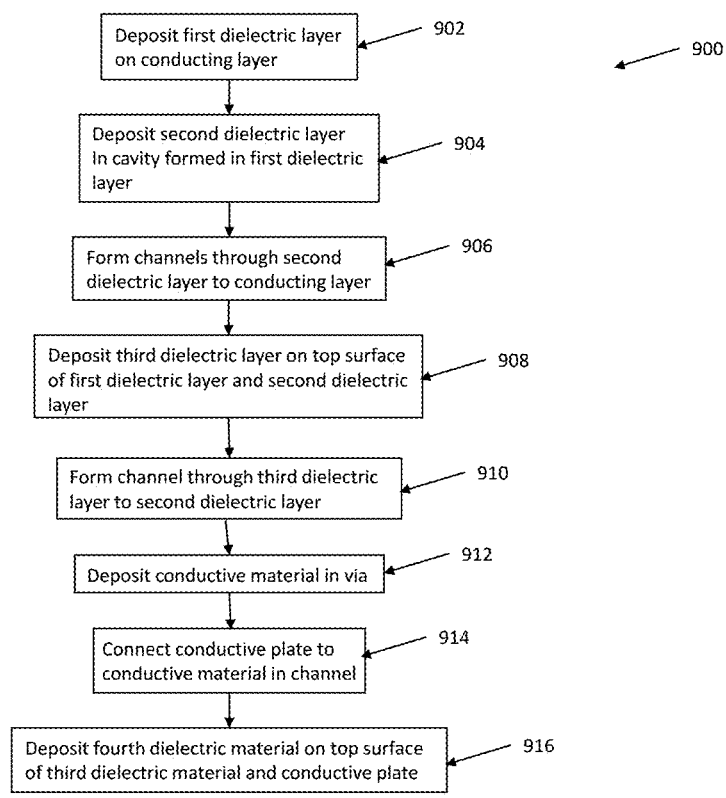

ELECTRONIC SWITCH AND ACTIVE ARTIFICIAL DIELECTRIC

CROSS-REFERENCE TO RELATED APPLICATIONS

This application claims priority under 35 U.S.C. § 119(e) to U.S. Provisional Application No. 62/140,452, filed on Mar. 30, 2015, entitled "Electronic Switch and Active Artificial Dielectric", the entire contents of which is incorporated by reference.

TECHNICAL FIELD OF THE INVENTION

The present disclosure relates in general to the field of switching devices, and more particularly, to an electronic switch and active artificial dielectric.

STATEMENT OF FEDERALLY FUNDED RESEARCH

None.

BACKGROUND OF THE INVENTION

Without limiting the scope of the invention, its background is described in connection with electronic switches. In many applications where a fast response is needed, electronic switches are a required element in the system. For example, an electronic switch can be used to turn on/off radiation from a microstrip antenna. With a large number of switchable microstrip antennas, an electrically steerable array antenna is realizable.

The most common electronic switch is a diode, specifically PIN diode. However implementation of diodes within a microstrip antenna structure is rather difficult. In this invention, a different type of switch is introduced. The basic principle of operation is dielectric breakdown. When the field strength is sufficiently high, the insulator becomes conducting, thus making the switch turned on.

The major problem in the process of successful design of an electronic switch is that the field strength required for dielectric breakdown is very high. For example, the minimum field strength for breakdown in air is about 3 MV/m.

SUMMARY OF THE INVENTION

The present disclosure provides electronic switches. Such electronic switches are useful in a variety of electronic devices, including active artificial dielectric, electronically beam-steerable antenna, phase shifters, or any other active devices that require fast response to changing environment. The operation of the electronic switch is based on the dielectric breakdown between two conductors. When the applied voltage is low, two conducting bodies are electrically insulated. With sufficient field strength in the dielectric region, a conducting channel is formed and the resistance in the dielectric gap becomes very small. In order to reduce the breakdown voltage, the separation distance between the two conducting bodies should be as small as possible.

In some implementations, the present disclosure provides a switching device having two conducting bodies, such as plates as in a microstrip antenna, separated by insulating substrate(s), and a conducting line that connects those two conductors except for a small insulating gap. When a voltage is applied between the conducting bodies, the electric field becomes most intense in the gap in the connecting line and most of the applied voltage drops at the gap region. Thus, the resistance of the device is mainly determined by the gap. If the applied field is relatively small, the effective resistance between the two conductors is very large because the two conductors are essentially insulated by the gap and the current through the connecting line is negligible, giving an off-state of the switch. However, when a sufficiently high voltage is applied, there will be dielectric-breakdown in the gap region and current flows with vanishing resistance in the gap, resulting in an on-state of the switch. The gap distance should be as small as possible to have a low applied voltage required for dielectric breakdown. Preferably, the cross-sectional area of the gap region is chosen to be small as well so that the energy spent for the switch operation can be minimized. Moreover when the conducting tip is small, the fringe effect near a conducting tip enhances the field strength in the conducting tip, thus reducing the breakdown voltage.

In the switching device, the connecting line between the two conductors can be fabricated by laser micromachining to from a via extending through the second dielectric layer, filling the via with a conductive material.

When the electronic switches described above are arranged properly, an active dielectric will result in which the dielectric constant can be varied by an applied voltage. The variable dielectric constant device includes of a number of electronic switches that are impregnated in a dielectric medium. Each layer has switching devices of its own unique dielectric-breakdown voltage. The breakdown voltage of each switching element is determined by the conduction gap in the device. There is variation of breakdown voltage in the direction perpendicular to the layers. When a low voltage below breakdown is applied across the electronic switch, presence of the metallic components does not affect the dielectric constant in the area in a macroscopic aspect. However, when the breakdown occurs, the switching device becomes a dipole, which will change the macroscopic permittivity significantly in the area. Consequently, the overall relative permittivity depends on the number of switch layers that are shorted by the applied voltage. Since there is gradual variation of the breakdown voltage in the direction of applied field, the number of breakdown layers, and consequently the dielectric constant, can be controlled by the applied voltage. In the active artificial dielectric, making the conducting connection line as thin as possible has the following two effects: (1) when the switch is off, the effective permittivity is about the same as the dielectric medium, and (2) power loss is minimized with the switching operation.

The present disclosure is described in detail below with reference to the accompanying drawings.

BRIEF DESCRIPTION OF THE DRAWINGS

For a more complete understanding of the features and advantages of the present disclosure, reference is now made to the detailed description of the invention along with the accompanying figures and in which:

FIG. 9 is a flowchart illustrating an example method for manufacturing the switch located in FIG. 8.

DETAILED DESCRIPTION OF THE INVENTION

While the making and using of various implementations of the present disclosure are discussed in detail below, it should be appreciated that the present disclosure provides many applicable inventive concepts that can be embodied in a wide variety of specific contexts. The specific implementations discussed herein are merely illustrative of specific ways to make and use the invention and do not delimit the scope of the invention.

Figure 1:
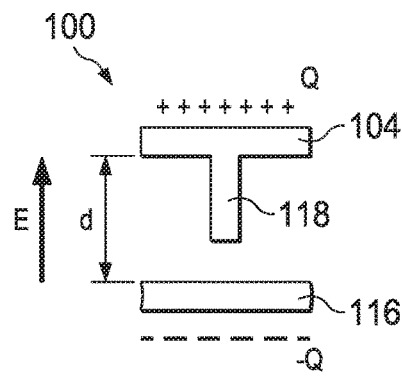
FIG. 1 shows an active dipole device in accordance with the present disclosure.

Now referring to FIG. 1, a switch 100 in accordance with one implementation of the present disclosure is shown. The switch 100 includes a conducting layer 104 and a conductive via 118 connected to the one conductive plate 104. When a voltage is applied between the conducting bodies, the electric field becomes most intense in the gap in the connecting line and most of the applied voltage drops at the gap region. Thus, the resistance of the device is mainly determined by the gap. If the applied field is relatively small, the effective resistance between the two conductors is very large because the two conductors are essentially insulated by the gap and the current through the connecting line is negligible, giving an off-state of the switch. However, when a sufficiently high voltage is applied, there will be dielectric-breakdown in the gap region and current flows with vanishing resistance in the gap, resulting in an on-state of the switch. The gap distance should be as small as possible to have a low applied voltage required for dielectric breakdown. The cross-sectional area of the gap region may be chosen to be small as well so that the energy spent for the switch operation may be minimized or otherwise reduced. Moreover when the conducting tip is small, the fringe effect near a conducting tip may enhance the field strength in the conducting tip, thus may reduce the breakdown voltage.

When the electronic switches described above are arranged properly, an active dielectric will result in which the dielectric constant can be varied by an applied voltage. The variable dielectric constant device includes of a number of electronic switches that are impregnated in a dielectric medium. Each layer has switching devices of its own unique dielectric-breakdown voltage. The breakdown voltage of each switching element is determined by the conduction gap in the device. There is variation of breakdown voltage in the direction perpendicular to the layers. When a low voltage below breakdown is applied across the electronic switch, presence of the metallic components may not affect the dielectric constant in the area in a macroscopic aspect. However, when the breakdown occurs, the switching device becomes a dipole, which may change the macroscopic permittivity significantly in the area. Consequently, the overall relative permittivity depends on the number of switch layers that are shorted by the applied voltage. Since there is gradual variation of the breakdown voltage in the direction of applied field, the number of breakdown layers, and consequently the dielectric constant, may be controlled by the applied voltage. In the active artificial dielectric, making the conducting connection line as thin as possible has the following two effects: (1) when the switch is off, the effective permittivity may be about the same as the dielectric medium, and (2) power loss may be minimized or otherwise reduced with the switching operation.

The switch and active artificial dielectric described herein can be used in many different devices and applications. For example, the switch and active artificial dielectric can be used in treatment and diagnostic medical devices, such as those used for cancer patients. For example, a treatment device can provide focused microwave beam on a targeted area to treat a cancerous region.

More specifically, the switch and active artificial dielectric can be used in conjunction with microstrip antennas to improve performance and other capabilities. This ability to operate at low voltages enables the switch to be used in different applications related to communication technology products such as electronically beam-steerable antenna, phase shifters, or any other communications systems or products that require fast responses to changing environment.

An extremely small (or variable) air gap in the electronic switch construction provides an active variable dielectric constant that allows the application of a comparatively smaller voltage to perform the switching function. In some implementations, the switch may incorporate a conducting pin into the top patch of a microstrip antenna design with the pin positioned proximate a conducting bottom ground plane. This positioning may allow a lower voltage to be applied between the tip of the pin and the conducting bottom plane to achieve a predetermined conduction property through dielectric breakdown.

Figure 2:
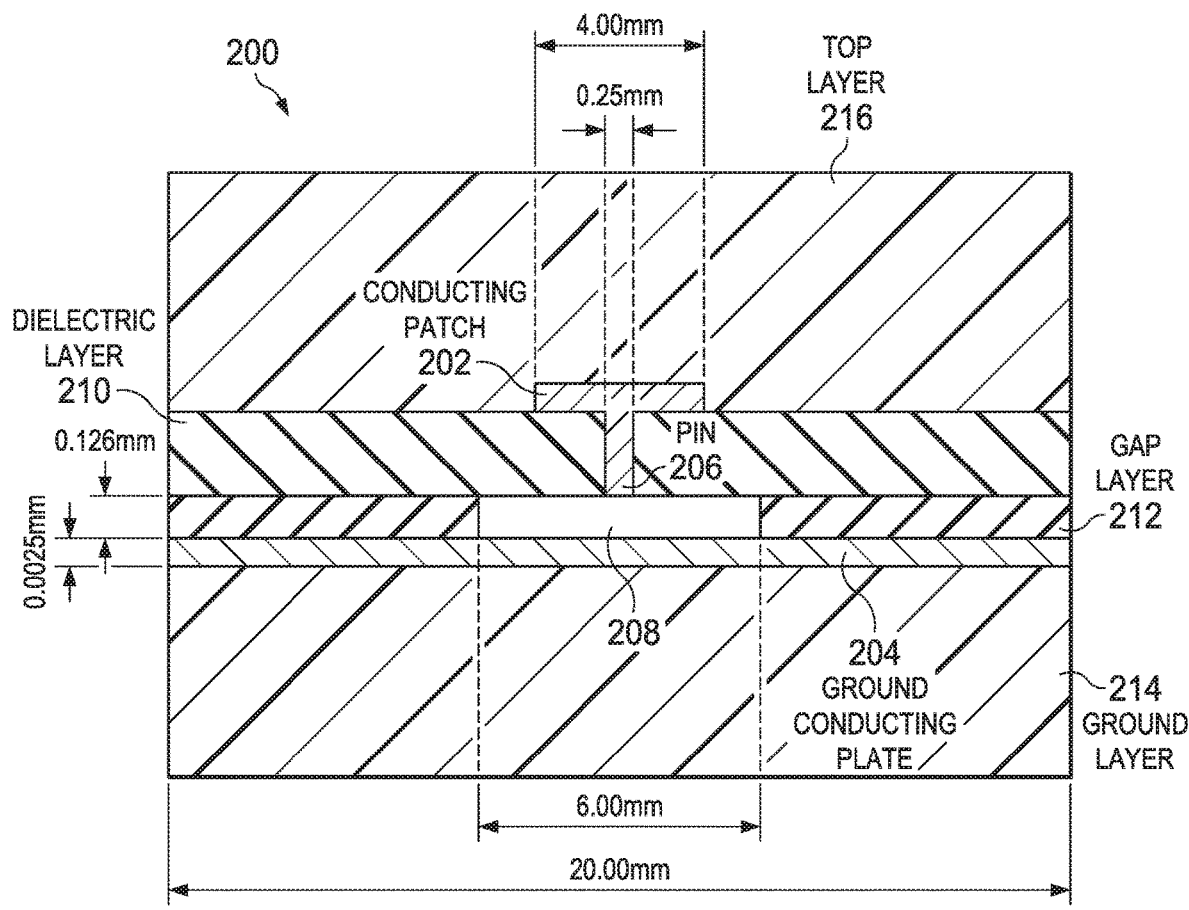
FIG. 2 shows a switch in accordance with some implementations of the present disclosure.

Referring now to FIG. 2, a switch 200 in accordance with another implementation of the present disclosure is shown. The switch 200 includes a top microstrip patch 202 and conducting ground plane 204 as in a microstrip antenna except that there is a thin conducting pin 206 that is connected to the top patch 202. The other side of the pin 206 is very close to the bottom patch 204 to form an air gap 208. When a voltage is applied across the two parallel plates 202 and 204, the fields become most intense in the air gap 208 between the tip of the center pin 206 and the bottom plate 204. The gap distance should be as small as possible which may result in a low applied voltage for dielectric breakdown. Moreover the pin diameter may be small as well so that the additional capacitance resulted from the presence of the pin 206 may be negligible and the antenna operation of the microstrip structure may not severely be affected by the extra feature for the switching mechanism. Also when the pin tip is small, the fringe effect near a conducting tip may enhance the field strength in the gap region, thus may reduce the breakdown voltage The dielectric layer 210 between the parallel plates 202 and 204 is polyimide (PI) film with a thickness of 0.125 mm. A hole or via of 0.250 mm diameter is made and filled with conducting ink before being cured for solidification to form the thin conducting pin 206. In order to have a gap 208 of consistent separation distance, a thin polyester film (gap layer 212) of 2.5 μm is placed between the dielectric layer 210 (PI film substrate) and the bottom copper plate 204. A portion of the polyester layer 212 is removed to have an air gap 208 between the tip of the center pin 206 and the bottom conducting plate 204. The size of the top conducting patch 202 in this example is 4 mm×6 mm. The air gap 208 is sufficiently large to cover the entire top patch 202. The top and bottom substrate layers 214 and 216 (e.g., dielectric layers like Rogers RO4003) provide mechanical support of the device 200. Thus the switch 200 can be used as a microstrip antenna if the feed line is connected.

Figure 3:
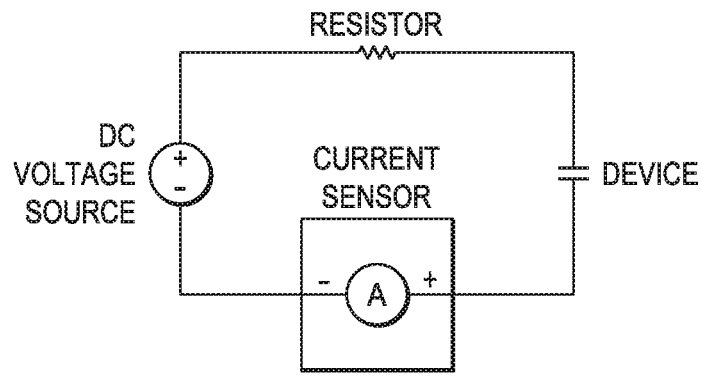
FIG. 3 shows a measurement setup used to test the switch shown in FIG. 2.
Figure 4:
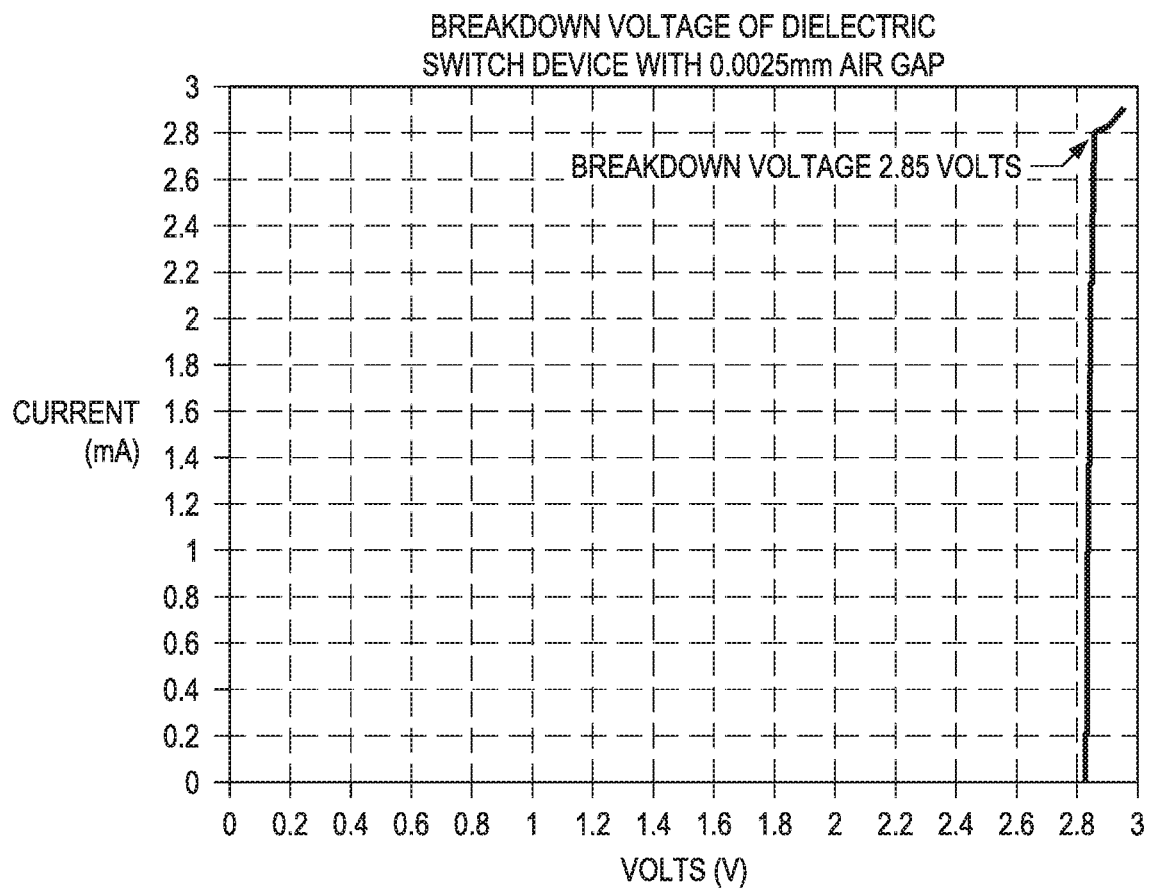
FIG. 4 is a graph showing the measured current versus applied voltage during the test of the switch shown in FIG. 2.

Now referring to FIGS. 3 and 4, the switch 200 may be tested using the measurement setup 300 shown in FIG. 3 where the current is measured as a function of the DC source voltage. The resistance of the resistor is 1 k, Q. As shown in FIG. 4, as the source voltage increases, the measured current is negligible until the voltage reaches the critical voltage of breakdown at 2.85 V. After the breakdown, the voltage across the device is extremely small. At the breakdown voltage of 2.85 V with the gap distance of 2.5 µm, the field strength within the air gap is approximately 1.14 MV/m. This is much smaller than reported values of breakdown voltage in air of 3 MV/m. The difference may be due to the fringe field effect which shows a singular behavior when the tip of a conducting pin 206 is very small.

Figure 5:
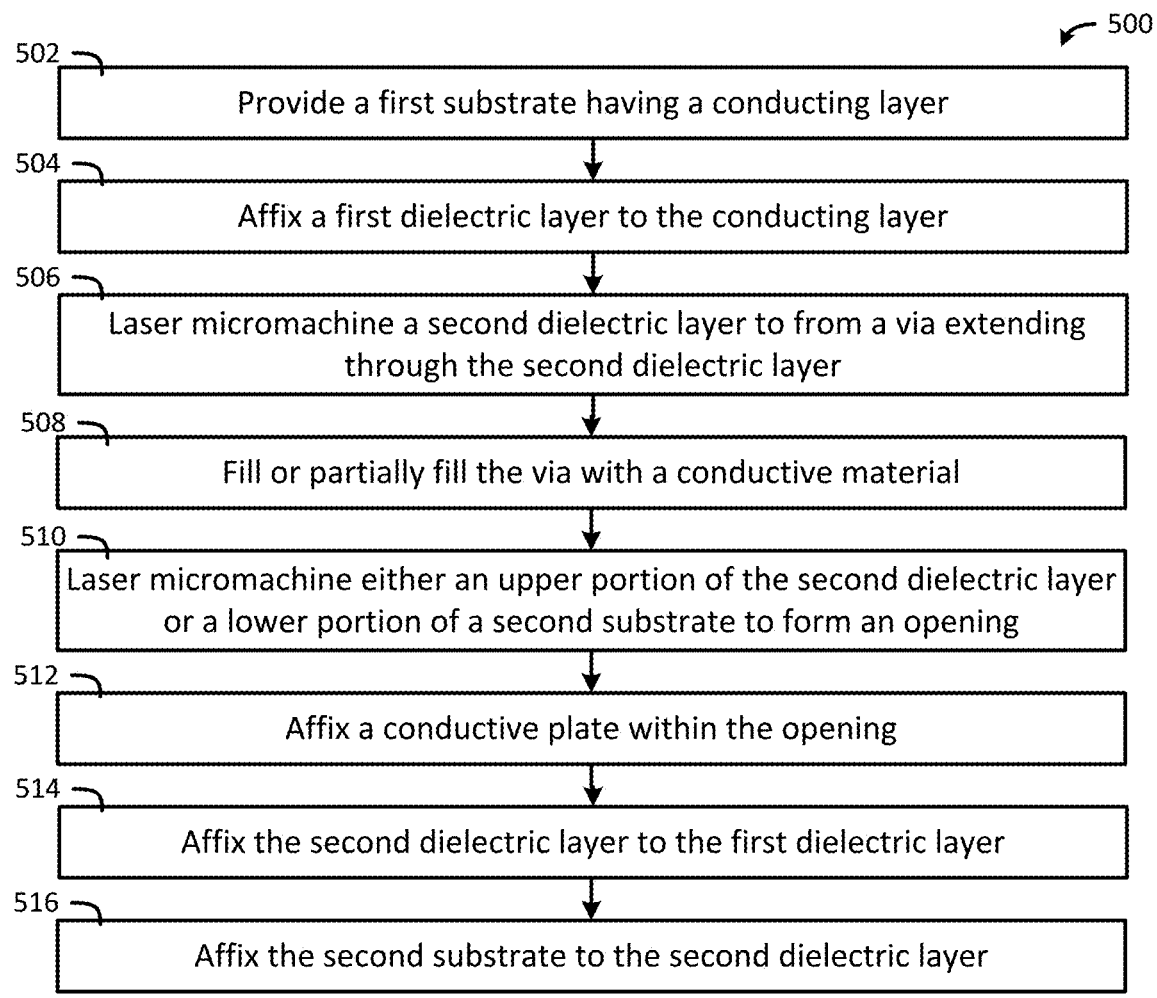
FIG. 5 is a flow chart of a method 500 for manufacturing a switch in accordance with some implementations of the present disclosure.

Referring now to FIG. 5, a flow chart of a method 500 for manufacturing a switch in accordance with some implementations of the present disclosure is shown. A first substrate having a conducting layer is provided in block 502, a first dielectric layer is affixed to the conducting layer in block 504, a second dielectric layer is laser micromachined to from a via extending through the second dielectric layer in block 506, the via is filled with a conductive material in block 508, either an upper portion of the second dielectric layer or a lower portion of a second substrate is laser micromached to form an opening in block 510, a conductive plate is affixed within the opening in block 512, the second dielectric layer is affixed to the first dielectric layer in block 514, and the second substrate is affixed to the second dielectric layer in block 516.

For example, the switch 200 shown in FIG. 2 may be fabricated by a combination of laser micromachining and layered manufacturing techniques. Laser micromachining may be performed using a Spectra Physics Nd:YLF laser with a wavelength of 349 nm, pulse width of 5 ns, and variable repetition rate from 1-5,000 Hz. The laser pulse energy and frequency can be varied independently, allowing control over the energy dosage on the sample. Patterns may be fabricated by mounting samples on x-y motion stages which can be controlled independently or coordinated to move simultaneously (such as to cut circular arcs). The velocity of each stage can be varied from 0.5-5 mm/s. The patterns were to be fabricated independently on separate layers, followed by assembly of the layers to form three-dimensional structures. Precision alignment of the features on each layer may be obtained by micromachining an outline of each pattern followed by machining through-holes in each layer relative to a common feature on each sample (such as a corner). Alignment pins could then be placed in the through holes to line up the patterns on each layer.

The process begins with laser micromachining of the dielectric substrate, which may be fabricated from Kapton HN® polyimide with a thickness of 125 µm. The polyimide may be positioned on the x-y stages and the outline of the sample may be cut with the laser, followed by laser cutting of a hole for the conductor pin. The conductor pin hole may be cut in the center of the layer and may have a diameter of 250 µm. The dielectric substrate has lateral dimensions of 20 mm×20 mm. The parameters that were found to work best for cutting through the polyimide sample were a laser frequency of 4,000 Hz with laser power at 100% with motion stages set at a velocity of 4 mm/s.

After removing the patterned polyimide from the x-y stages, the conductor material may be placed in the machined hole. A mask layer may be placed on one side of the dielectric with 8 mm×4 mm rectangular opening centered on the conductor pin hole in order to provide a soldering pad on one side of the conductor pin. The conductor material may be a Metalon® HPS-030LV silver screen printing ink, manufactured by Novacentrix. The Metalon ink is a water-based silver ink with silver particles less than 1 µm that can be oven cured at temperatures less than 300° C. The ink may be chosen because it may be a good compromise between small particle size (for filling conductor pin holes), moderately low electrical resistivity, and low cost. The ink may be spread over one side of the sample with a knife edge (doctor blade) to force the ink into the hole and into the rectangular mask opening. After curing the ink in the oven, the dielectric with conductor pin may be sandwiched between up upper layer of Rogers RO4003 (with the copper layers removed) and a bottom layer of Rogers RO4003 for the ground plate. An air gap of 2.5 µm may be maintained between the conductor pin and the conductor plate using a polyester film.

Figure 6:
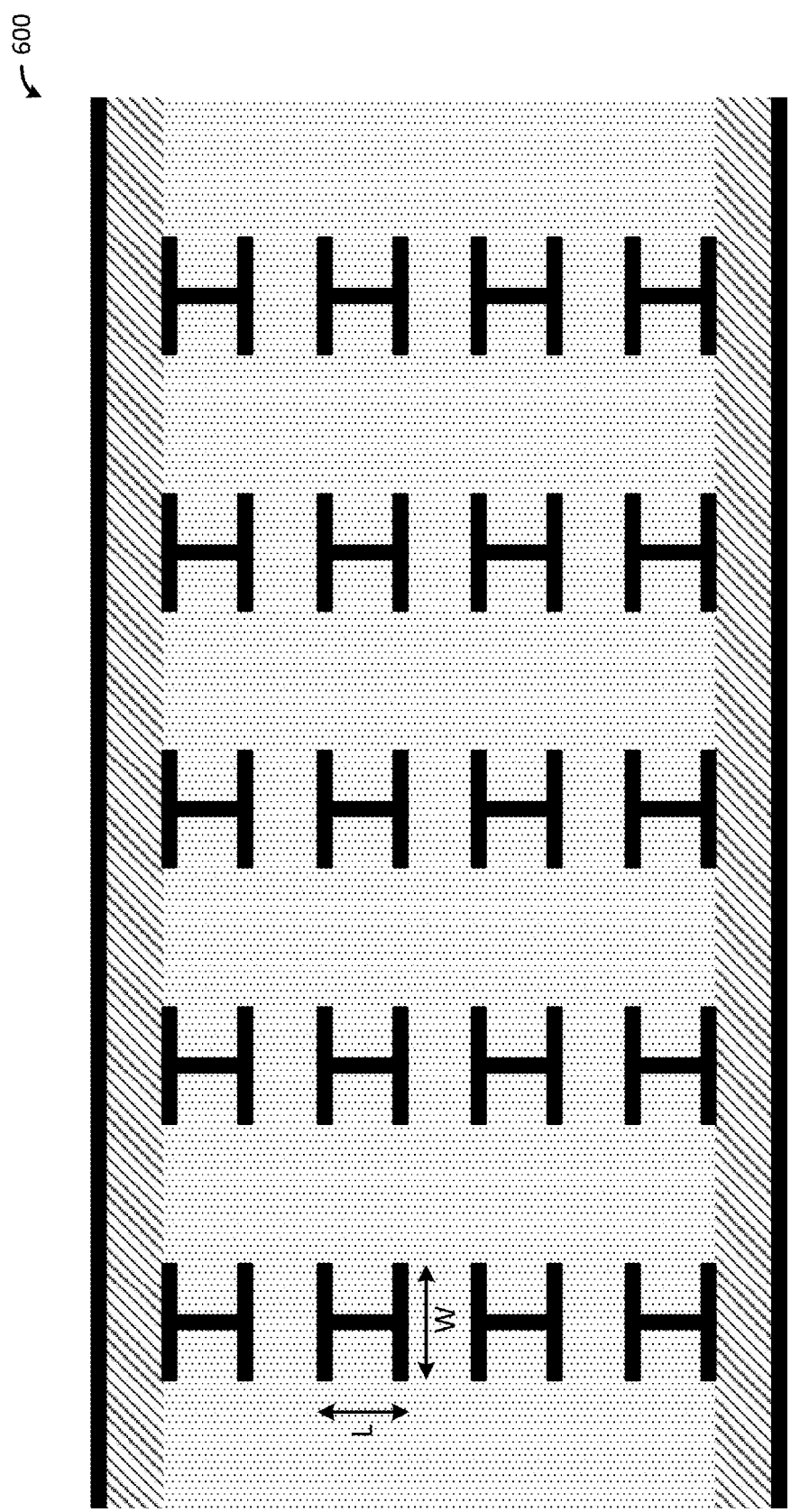
FIG. 6 shows a passive dielectric device in accordance with various implementations of the present disclosure.
Figure 7:
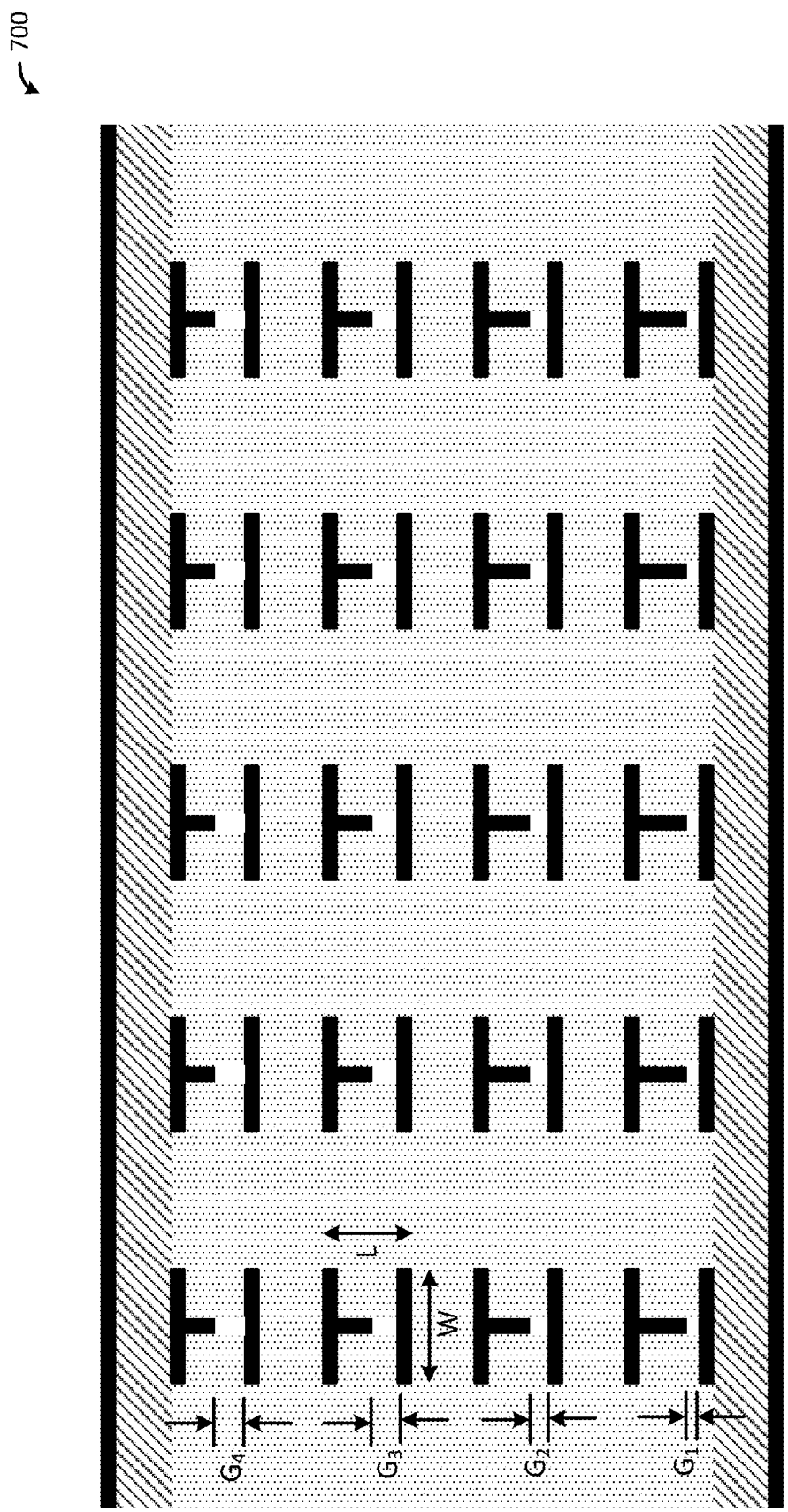
FIG. 7 shows an active dielectric device in accordance with various implementations of the present disclosure.

Now referring to FIG. 6, an active dielectric device 600 in accordance with various implementations of the present disclosure is shown. When the active switches are properly arranged in the active dielectric device, the dielectric constant of the switch can be varied by applying a voltage. There are a number of applications that require a varying dielectric constant. Each layer has its own dielectric breakdown and there will be variation of breakdown voltage in the vertical direction. Thus as the applied voltage increases, the number of breakdown layers goes up and the capacitance (as well as overall effective dielectric constant) becomes larger, thus effectively controlling the electrical properties by the applied field. The breakdown voltage of each switching element is determined by the gap between the tip of the center pin and the bottom plate. Thus controlling the gap will vary the breakdown field. The conductive elements have a Length and Width and are evenly spaced throughout the dielectric material. FIG. 7 shows an active dielectric device 700 in which the conductive elements are increasingly spaced apart from bottom to top: $G_1 < G_2 < G_3 < G_4$.

Figure 8:
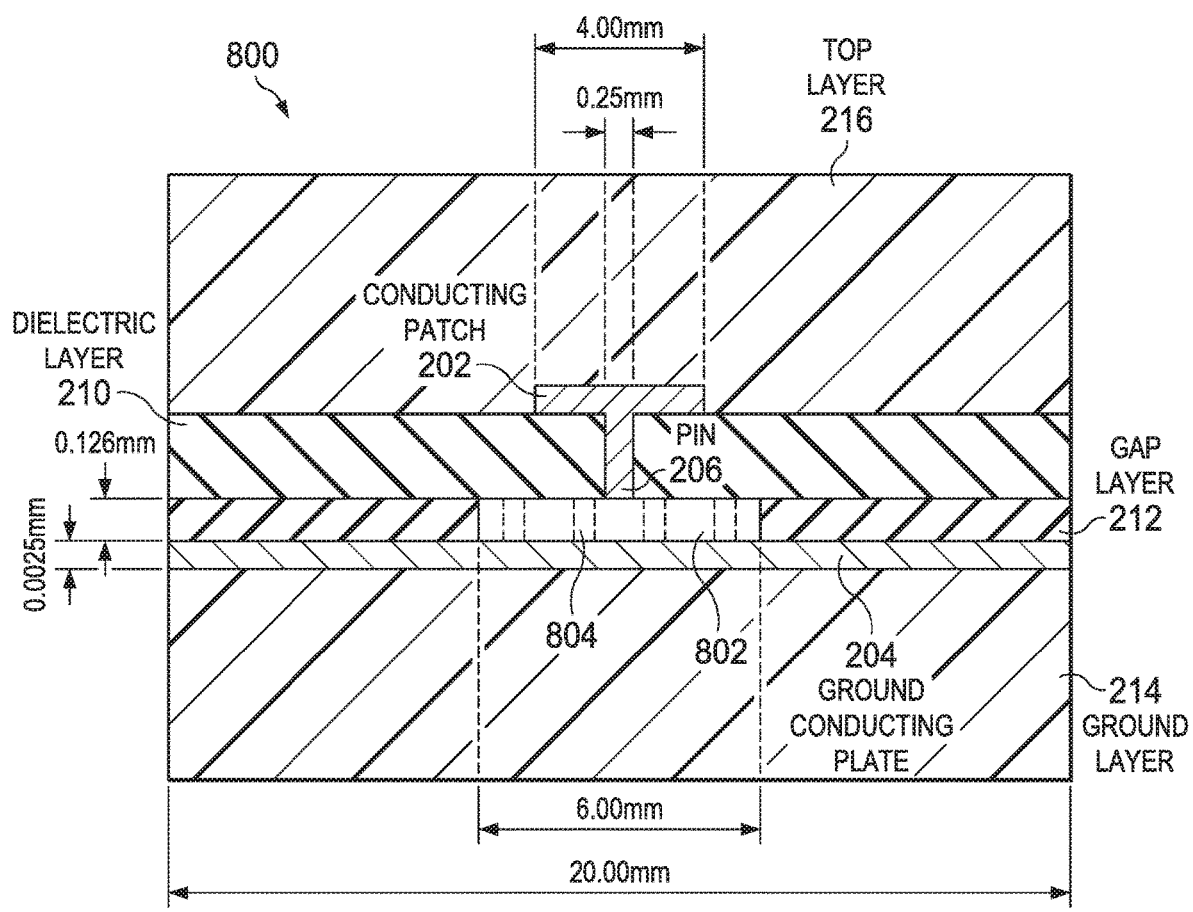
FIG. 8 shows a switch in accordance with some implementations of the present disclosure.

FIG. 8 illustrates an example switch 800 that includes a dielectric layer 802 that defines channels 804 between the ground conducting plate 204 and the dielectric layer 210. In comparison, the switch 200 illustrated in FIG. 2 includes an air gap 208. The dielectric layer 802 may be polyimide and/or polyester. In some implementations, as the number of channels 804 and/or volume of the channels 804 increase the breakdown voltage may decrease. The channels 804 may be cylindrical or other shapes without departing from the scope of the disclosure. The switch 800 includes a top microstrip patch 202 connected to a conducting pin 206 and conducting ground plane 204. The conducting pin 206 includes one end connected to the microstrip patch 202 and a second end proximate the dielectric layer 802. When a voltage is applied across the two parallel plates 202 and 204, the fields become most intense in the channels 804 between the end of the center pin 206 and the bottom plate 204. Smaller gap distances may have lower applied voltage for dielectric breakdown. Moreover, smaller pin diameters may make additional capacitance resulting from the presence of the pin 206 negligible and the antenna operation of the microstrip structure may not be severely affected by the extra feature for the switching mechanism. Also when the pin tip is small, the fringe effect near a conducting tip may enhance the field strength in the gap region, thus may reduce the breakdown voltage. In some implementations, the switch 800 may include other switches such as pin diodes.

FIG. 9 illustrates an example method 900 for manufacturing a switch. The method 900 includes, at step 902, a first dielectric layer defining cavity is deposited on a conducting layer. In reference to the example switch 800 illustrated in FIG. 8, the gap layer 212 may be deposited on the conducting plate 204 and defines a cavity. At step 904, a second dielectric layer may be deposited in the cavity defined by the first dielectric layer. In the example, the dielectric 802 may be deposited in the gap layer 212. Next, at step 906, channels are formed through the second dielectric layer. Returning to the example, channels 704 may be formed in the dielectric layer 802. In some implementations, the channels may be formed using a chemical and/or physical process. At step 908, a third dielectric layer is deposited on the top surface of the first and second dielectric layers. As for the example, the dielectric layer 210 is deposited on the top surface of the gap layer 212 and the dielectric layer 214. Next, at step 910, a channel is formed through the third dielectric to the second dielectric layer. In the example, a channel is formed through the dielectric layer 210 to the dielectric layer 802. At step 912, a conductive material is deposited in the channel. Returning to the example, the pin 206 is deposited in the channel. Next, at step 914, a conductive plate is connected to the conductive material in the channel. As for the example, the conducting patch 202 is connected to the pin 206. At step 916, a four dielectric material is deposited on the top surface of the third dielectric material and the conductive plate. In the example, the top layer 216 is deposited on the top surface of the dielectric layer 210 and the conducting patch 202.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

The word "exemplary" is used herein to mean "serving as an example, instance, or illustration." Any implementation described herein as "exemplary" is not necessarily to be construed as preferred or advantageous over other implementations.

As used in this specification and claim(s), the words "comprising" (and any form of comprising, such as "comprise" and "comprises"), "having" (and any form of having, such as "have" and "has"), "including" (any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or items, such as BB, AAA, AB, BBC, AAABCCCC, CBBAAA, CABABB, and so forth. The skilled artisan will understand that typically there is not a limit on the number of item or items in any combination, unless otherwise apparent from the context.

It will be understood by those of skill in the art that information and signals may be represented using any of a variety of different technologies and techniques (e.g., data, instructions, commands, information, signals, bits, symbols, and chips may be represented by voltages, currents, electromagnetic waves, magnetic fields or particles, optical fields or particles, or any combination thereof). Likewise, the various illustrative logical blocks, modules, circuits, and algorithm steps described herein may be implemented as electronic hardware, computer software, or combinations of both, depending on the application and functionality. Moreover, the various logical blocks, modules, and circuits described herein may be implemented or performed with a general purpose processor (e.g., microprocessor, conventional processor, controller, microcontroller, state machine or combination of computing devices), a digital signal processor ("DSP"), an application specific integrated circuit ("ASIC"), a field programmable gate array ("FPGA") or other programmable logic device, discrete gate or transistor logic, discrete hardware components, or any combination thereof designed to perform the functions described herein. Similarly, steps of a method or process described herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. Although preferred implementations of the present disclosure have been described in detail, it will be understood by those skilled in the art that various modifications can be made therein without departing from the spirit and scope of the invention as set forth in the appended claims.

All publications and patent applications mentioned in the specification are indicative of the level of skill of those skilled in the art to which this invention pertains. All publications and patent applications are herein incorporated by reference to the same extent as if each individual publication or patent application may be specifically and individually indicated to be incorporated by reference.

What is claimed is:

1. A method for fabricating a switching device comprising:
   providing a first substrate having a conducting layer;
   creating one or more dielectric breakdown switching layers on the conducting layer, each dielectric breakdown switching layer comprising a first dielectric layer and one or more second dielectric layers, and one or more conducting elements comprising at least one conductive plate disposed on or within each second dielectric layer, and a conductive via connected to the at least one conductive plate and extending through the second dielectric layer and toward the conducting layer but spaced apart from the conducting layer;
   creating an opening in the first dielectric layer proximate to the conductive via that forms a gap between the conducting layer and the conductive via within the second dielectric layer, wherein the gap extends directly between a tip of the conductive via and the conducting layer; and
   creating a second substrate on the second dielectric layer.

2. The method as recited in claim 1, wherein providing the first substrate having the conducting layer comprises:
   providing the first substrate; and affixing or depositing the conducting layer on the first substrate.

3. The method as recited in claim 1, wherein creating one or more dielectric breakdown switching layers comprises:
providing the second dielectric layer;
creating the one or more conducting elements by creating the conductive via extending through the second dielectric layer, and affixing or depositing the at least one conductive plate on or within the second dielectric layer such that the at least one conductive plate is connected to the conductive via; and
affixing the second dielectric layer to the first dielectric layer.

4. The method as recited in claim 1, wherein creating the conductive via comprises:
creating a via extending through the second dielectric layer; and
filling the via with a conductive material.

5. The method as recited in claim 1, further comprising filling the gap with air or a gas.

6. The method as recited in claim 1, further comprising depositing or affixing a dielectric material or a semi-dielectric material within all or part of the opening in the first dielectric layer that is different than the first dielectric layer.

7. The method as recited in claim 1, wherein the gap is formed to have a low dielectric breakdown voltage.

8. The method as recited in claim 1, wherein the opening in the first dielectric layer is larger than the conductive plate.

9. The method as recited in claim 1, wherein each dielectric breakdown switching layer has a specified dielectric breakdown voltage.

10. The method as recited in claim 9, wherein the specified dielectric breakdown voltage is different for each dielectric breakdown switching layer.

11. The method as recited in claim 1, wherein a diameter of the conductive via is formed to minimize power consumption for switching operation.

12. The method as recited in claim 11, wherein the tip of the conductive via is formed to provide a fringe effect near the tip that enhances a field strength in the first dielectric layer, thus reducing the breakdown voltage.

13. The method as recited in claim 1, wherein the at least one conductive plate is disposed on the second dielectric layer proximate to the second substrate.

14. The method as recited in claim 1, wherein the at least one conductive plate is disposed proximate to the first dielectric layer.

15. The method as recited in claim 1, wherein creating one or more dielectric breakdown switching layers comprises:
creating a lower second dielectric layer on the conducting layer, the lower second dielectric having the one or more conducting elements;
creating the first dielectric layer on the bottom second dielectric layer; and
creating an upper second dielectric layer on the first dielectric layer, the upper second dielectric having the one or more conducting elements.

16. The method as recited in claim 15, wherein the at least one conductive plate of the one or more conducting elements comprises:
a first conductive plate proximate to the upper second dielectric layer; and
a second conductive plate proximate to the lower second dielectric layer.

17. The method as recited in claim 1, wherein:
the first dielectric layer comprises a polyester film;
the second dielectric layer comprises a polyimide film;
the conductive plate comprises a top microstrip patch; and
the conductive layer comprises a conducting ground plane.

18. The method as recited in claim 1, further comprising:
connecting a radio frequency energy source to the conductive plate;
connecting a voltage control circuit to the conductive plate; and
wherein the switch comprises an antenna.

19. The method of claim 1, wherein the first dielectric layer is different from the one or more second dielectric layers.

20. The method of claim 1, wherein the opening in the first dielectric layer has a cross-sectional area larger than a cross-sectional area of the conductive plate.

* * * * *

UNITED STATES PATENT AND TRADEMARK OFFICE
CERTIFICATE OF CORRECTION

PATENT NO. : 10,854,761 B1  
APPLICATION NO. : 15/085422  
DATED : December 1, 2020  
INVENTOR(S) : Choon Sae Lee, David A Willis and Yang Fan Page 1 of 1

It is certified that error appears in the above-identified patent and that said Letters Patent is hereby corrected as shown below:

On the Title Page

Item [72], delete "Daivd" and Insert -- David --, therefor.

Signed and Sealed this
Twentieth Day of April, 2021

Drew Hirshfeld
*Performing the Functions and Duties of the
Under Secretary of Commerce for Intellectual Property and
Director of the United States Patent and Trademark Office*